(12) United States Patent
Lafort

(10) Patent No.: US 10,656,006 B2
(45) Date of Patent: May 19, 2020

(54) SENSING CIRCUIT COMPRISING AN AMPLIFYING CIRCUIT AND AN AMPLIFYING CIRCUIT

(71) Applicant: Sonion Nederland B.V., Hoofddorp (NL)

(72) Inventor: Adrianus Maria Lafort, Hoofddorp (NL)

(73) Assignee: Sonion Nederland B.V., Hoofddorp (NL)

( * ) Notice: Subject to any disclaimer, the term of this patent is extended or adjusted under 35 U.S.C. 154(b) by 105 days.

(21) Appl. No.: 15/816,142

(22) Filed: Nov. 17, 2017

(65) Prior Publication Data

US 2018/0143068 A1 May 24, 2018

(30) Foreign Application Priority Data

Nov. 18, 2016 (EP) .................................... 16199653

(51) Int. Cl.
*H03F 3/45* (2006.01)
*G01H 11/06* (2006.01)
*H04R 3/02* (2006.01)
*H03F 1/34* (2006.01)
*H03F 1/08* (2006.01)
(Continued)

(52) U.S. Cl.
CPC ............... *G01H 11/06* (2013.01); *H03F 1/08* (2013.01); *H03F 1/34* (2013.01); *H03F 3/181* (2013.01); *H03F 3/45183* (2013.01); *H03F 3/45215* (2013.01); *H03F 2200/129* (2013.01); *H03F 2200/144* (2013.01); *H03F 2200/171* (2013.01); *H03F 2200/258* (2013.01); *H03F 2200/42* (2013.01); *H03F 2203/45026* (2013.01); *H03F 2203/45034* (2013.01); *H03F 2203/45512* (2013.01); *H04R 3/00* (2013.01)

(58) Field of Classification Search
USPC ......................................... 330/174, 277, 298
See application file for complete search history.

(56) References Cited

U.S. PATENT DOCUMENTS 6,788,796 B1 9/2004 Miles
6,831,577 B1 12/2004 Furst
(Continued)

FOREIGN PATENT DOCUMENTS

EP 1553696 A1 7/2005
EP 2648333 A3 10/2013
(Continued)

OTHER PUBLICATIONS

Anonymous; "Q. Are back-electret mics any good?"; Sound on Sound; Aug. 3, 2016; XP055535410; retrieved from the Internet: https://web.archive.org/web/20160803061346/https://www.soundonsound.com/sound-advice/q-are-back-electret-mics-any-good (3 pages).

(Continued)

*Primary Examiner* — Hieu P Nguyen
(74) *Attorney, Agent, or Firm* — Nixon & Peabody LLP

(57) ABSTRACT

A sensing system with an AC feedback to the non-signal and non-biased terminal of the transducer. An impedance element, such as two anti-parallel diodes, are provided at the amplifier input, and the amplifier gain is negative and has a size sufficient to ensure that the input on the one terminal does not exceed the forward voltage of the diode.

15 Claims, 2 Drawing Sheets

(51) Int. Cl.
*H03F 3/181* (2006.01)
*H04R 3/00* (2006.01)

(56) References Cited

U.S. PATENT DOCUMENTS

| | | | |
|---|---|---|---|
| 6,853,290 B2 | 2/2005 | Jorgensen |
| 6,859,542 B2 | 2/2005 | Johannsen |
| 6,888,408 B2 | 5/2005 | Furst |
| 6,914,992 B1 | 7/2005 | van Halteren |
| 6,919,519 B2 | 7/2005 | Ravnkilde |
| 6,930,259 B1 | 8/2005 | Jorgensen |
| 6,943,308 B2 | 9/2005 | Ravnkilde |
| 6,974,921 B2 | 12/2005 | Jorgensen |
| 7,008,271 B2 | 3/2006 | Jorgensen |
| 7,012,200 B2 | 3/2006 | Moller |
| 7,062,058 B2 | 6/2006 | Steeman |
| 7,062,063 B2 | 6/2006 | Hansen |
| 7,072,482 B2 | 7/2006 | Van Doorn |
| 7,088,839 B2 | 8/2006 | Geschiere |
| 7,110,560 B2 | 9/2006 | Stenberg |
| 7,136,496 B2 | 11/2006 | van Halteren |
| 7,142,682 B2 | 11/2006 | Mullenborn |
| 7,149,317 B2 | 12/2006 | Lafort |
| 7,181,035 B2 | 2/2007 | van Halteren |
| 7,190,803 B2 | 3/2007 | van Halteren |
| 7,206,428 B2 | 4/2007 | Geschiere |
| 7,221,766 B2 | 5/2007 | Boor |
| 7,221,767 B2 | 5/2007 | Mullenborn |
| 7,221,769 B1 | 5/2007 | Jorgensen |
| 7,227,968 B2 | 6/2007 | van Halteren |
| 7,239,714 B2 | 7/2007 | de Blok |
| 7,245,734 B2 | 7/2007 | Niederdraenk |
| 7,254,248 B2 | 8/2007 | Johannsen |
| 7,286,680 B2 | 10/2007 | Steeman |
| 7,292,700 B1 | 11/2007 | Engbert |
| 7,292,876 B2 | 11/2007 | Bosh |
| 7,336,794 B2 | 2/2008 | Furst |
| 7,376,240 B2 | 5/2008 | Hansen |
| 7,403,630 B2 | 7/2008 | Jorgensen |
| 7,415,121 B2 | 8/2008 | Mögelin |
| 7,425,196 B2 | 9/2008 | Jorgensen |
| 7,460,681 B2 | 12/2008 | Geschiere |
| 7,466,835 B2 | 12/2008 | Stenberg |
| 7,492,919 B2 | 2/2009 | Engbert |
| 7,548,626 B2 | 6/2009 | Stenberg |
| 7,657,048 B2 | 2/2010 | van Halteren |
| 7,684,575 B2 | 3/2010 | van Halteren |
| 7,706,561 B2 | 4/2010 | Wilmink |
| 7,715,583 B2 | 5/2010 | Van Halteren |
| 7,728,237 B2 | 6/2010 | Pedersen |
| 7,809,151 B2 | 10/2010 | Van Halteren |
| 7,822,218 B2 | 10/2010 | Van Halteren |
| 7,899,203 B2 | 3/2011 | Van Halteren |
| 7,912,240 B2 | 3/2011 | Madaffari |
| 7,946,890 B1 | 5/2011 | Bondo |
| 7,953,241 B2 | 5/2011 | Jorgensen |
| 7,961,899 B2 | 6/2011 | Van Halteren |
| 7,970,161 B2 | 6/2011 | van Halteren |
| 8,098,854 B2 | 1/2012 | van Halteren |
| 8,101,876 B2 | 1/2012 | Andreasen |
| 8,103,039 B2 | 1/2012 | van Halteren |
| 8,160,290 B2 | 4/2012 | Jorgensen |
| 8,170,237 B2 | 5/2012 | Shajaan |
| 8,170,249 B2 | 5/2012 | Halteren |
| 8,189,804 B2 | 5/2012 | Hruza |
| 8,189,820 B2 | 5/2012 | Wang |
| 8,223,981 B2 | 7/2012 | Haila |
| 8,223,996 B2 | 7/2012 | Beekman |
| 8,233,652 B2 | 7/2012 | Jorgensen |
| 8,259,963 B2 | 9/2012 | Stenberg |
| 8,259,976 B2 | 9/2012 | van Halteren |
| 8,259,977 B2 | 9/2012 | Jorgensen |
| 8,280,082 B2 | 10/2012 | van Halteren |
| 8,284,966 B2 | 10/2012 | Wilk |
| 8,313,336 B2 | 11/2012 | Bondo |
| 8,315,422 B2 | 11/2012 | van Halteren |
| 8,331,595 B2 | 12/2012 | van Halteren |
| 8,369,552 B2 | 2/2013 | Engbert |
| 8,379,899 B2 | 2/2013 | van Halteren |
| 8,509,468 B2 | 8/2013 | van Halteren |
| 8,526,651 B2 | 9/2013 | Lafort |
| 8,526,652 B2 | 9/2013 | Ambrose |
| 8,625,809 B2 | 1/2014 | Josefsson |
| 8,630,429 B2 | 1/2014 | Daley |
| 8,873,773 B2 | 10/2014 | Akino |
| 9,148,729 B2 | 9/2015 | Josefsson |
| 9,197,967 B2 | 11/2015 | Mortensen |
| 9,300,259 B2 | 3/2016 | Frohlich |
| 9,634,628 B2 * | 4/2017 | Nicollini ............ H03F 3/45076 |
| 9,716,945 B2 | 7/2017 | Lesso |
| 9,781,518 B2 | 10/2017 | Schober |
| 2002/0125949 A1 | 9/2002 | Stenberg |
| 2004/0179703 A1 | 9/2004 | Boor |
| 2007/0160234 A1 | 7/2007 | Deruginsky |
| 2008/0025531 A1 | 1/2008 | Suzuki |
| 2008/0205668 A1 | 8/2008 | Torii |
| 2009/0003629 A1 | 1/2009 | Shajaan |
| 2010/0166228 A1 | 7/2010 | Steele |
| 2010/0246859 A1 | 9/2010 | Filippo |
| 2010/0329487 A1 | 12/2010 | David |
| 2011/0182453 A1 | 7/2011 | van Hal |
| 2011/0189880 A1 | 8/2011 | Bondo |
| 2011/0299708 A1 | 12/2011 | Bondo |
| 2011/0299712 A1 | 12/2011 | Bondo |
| 2011/0311069 A1 | 12/2011 | Ambrose |
| 2012/0014548 A1 | 1/2012 | van Halteren |
| 2012/0027245 A1 | 2/2012 | van Halteren |
| 2012/0140966 A1 | 6/2012 | Mocking |
| 2012/0155683 A1 | 6/2012 | van Halteren |
| 2012/0155694 A1 | 6/2012 | Reeuwijk |
| 2012/0206205 A1 | 8/2012 | Hoogzaad |
| 2012/0255805 A1 | 10/2012 | van Halteren |
| 2012/0269367 A1 | 10/2012 | Akino |
| 2013/0028451 A1 | 1/2013 | de Roo |
| 2013/0051582 A1 | 2/2013 | Kropfitsch |
| 2013/0129117 A1 | 5/2013 | Thomsen |
| 2013/0136284 A1 | 5/2013 | van Hal |
| 2013/0142370 A1 | 6/2013 | Engbert |
| 2013/0163799 A1 | 6/2013 | Van Halteren |
| 2013/0195291 A1 | 8/2013 | Josefsson |
| 2013/0195295 A1 | 8/2013 | van Halteren |
| 2014/0003609 A1 | 1/2014 | Rombach |
| 2014/0037121 A1 | 2/2014 | Mortensen |
| 2014/0086433 A1 | 3/2014 | Josefsson |
| 2014/0264652 A1 | 9/2014 | Cagdaser |
| 2015/0023529 A1 | 1/2015 | Barzan |
| 2015/0137834 A1 | 5/2015 | Steiner |
| 2015/0181352 A1 | 6/2015 | Astgimath |
| 2015/0245143 A1 | 8/2015 | Akino |
| 2016/0337753 A1 | 11/2016 | Akino |
| 2016/0352294 A1 | 12/2016 | Nicollini |
| 2017/0180858 A1 | 6/2017 | Kidambi |
| 2017/0195788 A1 | 7/2017 | Nicollini |
| 2017/0223450 A1 | 8/2017 | Alvarez |
| 2018/0014123 A1 | 1/2018 | Shajaan |
| 2018/0027338 A1 | 1/2018 | Shajaan |
| 2018/0143068 A1 | 5/2018 | Lafort |

FOREIGN PATENT DOCUMENTS

| | | |
|---|---|---|
| EP | 2978241 A1 | 1/2016 |
| EP | 1906704 A1 | 4/2018 |
| JP | 2006-295357 A | 10/2006 |
| WO | WO 01/78446 A1 | 10/2001 |
| WO | WO 2013/167183 A1 | 11/2003 |
| WO | WO 2012/148077 A3 | 11/2012 |

OTHER PUBLICATIONS

Extended European Search Report in European Patent Application No. EP 16199651, dated Mar. 31, 2017 (3 pages).
Extended European Search Report in European Patent Application No. EP 16199657, dated Apr. 11, 2017 (3 pages).

(56) References Cited

OTHER PUBLICATIONS

Extended European Search Report in European Patent Application No. EP 16199644, dated May 10, 2017 (3 pages).
Extended European Search Report in European Patent Application No. EP 16199653, dated May 11, 2017 (3 pages).
Pedersen M. et al., "High-Performance Condenser Microphone with Fully Integrated CMOS Amplifier and DC-DC Voltage Converter," Journal of Microelectromechanical Systems, vol. 7, No. 4, Dec. 1998, pp. 387-394 (8 pages).
Extended European Search Report in European Patent Application No. EP17202253, dated Mar. 15, 2018 (3 pages).
Extended European Search Report in European Patent Application No. EP 17202256, dated Mar. 21, 2018 (3 pages).
Extended European Search Report in European Patent Application No. EP 17202265, dated Apr. 10, 2018 (3 pages).

\* cited by examiner

SENSING CIRCUIT COMPRISING AN AMPLIFYING CIRCUIT AND AN AMPLIFYING CIRCUIT

CROSS-REFERENCE TO RELATED APPLICATIONS

This application claims the benefit of European Patent Application Serial No. 16199653.3, filed Nov. 18, 2016, which is incorporated herein by reference in its entirety.

FIELD OF THE INVENTION

The present invention relates to an amplifying circuit and a sensing circuit especially adapted to transducer types requiring a high impedance on the terminal outputting the output signal.

BACKGROUND OF THE INVENTION

Technologies of this type may be seen in e.g. U.S. Pat. Nos. 9,148,729, 8,170,237, US20040179703, US2014/0086433, and US20150137834.

In a first aspect, the invention relates to a sensing system comprising:
- a transducer having a first output terminal and a second output terminal,
- a first voltage supply configured to supply a first voltage to the first output terminal,
- an amplifier having an amplifier input and an amplifier output,
- a connection element connecting the first output terminal to the amplifier input, the connection element comprising an impedance element connected also to a predetermined voltage, the impedance element having:
  - a first impedance, when a voltage over the impedance element is below a threshold voltage and
  - a second impedance, lower than the first impedance, when a voltage over the impedance element exceeds the threshold voltage, the first impedance exceeding the second impedance and
- a filter circuit blocking DC but transferring AC, the circuit connected to the amplifier output configured to feed an AC signal to the second output terminal, where the amplifier has a negative amplification with an absolute value higher than or equal to the first voltage divided by the threshold voltage.

SUMMARY OF INVENTION

A transducer is an element configured to sense or detect a parameter of the transducer or its surroundings, such as vibration or sound. Often, the transducer will have a stationary element and a movable element and will output a signal corresponding to a variation of a distance between the movable element and the stationary element. In this respect, corresponding often means that the frequency contents of the output signal, at least within a predetermined frequency interval, corresponds to that of the parameter detected.

Often, a transducer is an element configured to sense movement of a movable element in relation to one or more stationary element(s). Naturally, it is of no importance which element moves in relation to another element. The distance/position variation between the movable element and the stationary element(s) will cause an output signal on the transducer output.

Naturally, which element is stationary and movable will depend on in which coordinate system one views the system. In many situations, the movable element is more resilient and bendable, for example, than the stationary element, so that the stationary element is stationary in relation to a remainder, such as a housing, of the transducer. Naturally, multiple movable elements may be used in addition to or instead of a movable element and a stationary element. Also, multiple stationary elements may be used together with the one or more movable elements.

Any number of stationary elements may be provided. Often one or two stationary elements are provided in situations where the movable element is a plane element, where the stationary element(s) is/are also plane element(s) provided parallel to the movable element in a desired distance so that the movable element may move while being in a vicinity of the stationary element(s). Transducers of this type may be microphones, where the movable element then may be a diaphragm.

The transducer has at least two transducer terminals. The output signal is normally output as a difference in voltage between two terminals. Thus, the output may be seen as derived from one of the terminals, if the other is kept at a predetermined, fixed voltage, such as ground.

One type of transducer is a capacitive transducer which is an electro-acoustical or electro-mechanical transducer, the capacitance of which varies with the parameter sensed. An electrical field may be generated in the transducer by biasing two elements therein (providing a voltage between the elements). When that or another element moves within that field, an output signal may be derived which relates to the change in capacitance due to this movement.

The biasing voltage may be provided between two of the movable element and the stationary element(s). If a single stationary element is provided, the first voltage is provided between the stationary element and the movable element. If two stationary elements are provided, the voltage may be provided between the stationary elements or between one stationary element and the movable element. Naturally, different voltages may be provided to all of the stationary elements and the movable element.

Multiple movable elements may also be provided if desired, where any additional movable element may also receive a voltage and/or output a signal.

An output of the transducer may be derived from any one or more of the stationary element(s) and the movable element. Usually, the output of the transducer will depend on the movement or position of the movable element in relation to the stationary element(s).

Often, capacitive transducers are supplied with a bias voltage via two terminals over which the output signal is also provided.

A microphone usually comprises a diaphragm which divides an inner space into two chambers. One or both chambers has a sound inlet.

Naturally, the output terminals may be elements which are accessible on an exterior of the transducer in order or conductors to be attached thereto, such as by welding, soldering or gluing. However, the transducer may also be directly coupled to the connection element and circuit so that the same conductor extends from the transducer to these elements.

The amplifier has at least one amplifier input. Often, multiple inputs are provided. In such situations, the other input(s) may be connected to other components or elements in the circuit or external to the circuit. In a preferred embodiment, other input(s) is/are connected to a predetermined constant voltage, such as ground.

The amplifier has a negative amplification with an absolute value higher than or equal to the first voltage divided by the threshold voltage. Thus, the polarity of the output voltage is the opposite of that received on the input. In addition to that, the absolute value of the voltage output is multiplied, compared to that received on the input, by the gain factor. Naturally, deviations from this may be seen due to manufacturing deviations etc. However, the feedback network may cancel out deviations.

Actually, the gain may be desired even higher, such as at least 1.25 times the first voltage divided by the threshold voltage. The multiplying factor may even be 1.5, 1.75, 2, 2.25, 2.5, 2.75 or 3, as this may reduce the output voltage swing at the first terminal even more. For typical impedance elements, the impedance does not change abruptly when the voltage over it crosses the threshold voltage. Thus, the impedance may be undesirably low even if the voltage over the impedance element is below the threshold voltage. Thus, it may be desired to ensure that the voltage over the impedance element is kept below 80%, such as below 75%, such as below 70%, such as below 60%, such as below 50% of the threshold voltage.

The absolute value of the gain is at least the first voltage divided by the predetermined voltage. In this manner, any voltage generated over the first and second output terminals may be reduced, due to the negative feedback, to a voltage not exceeding the threshold voltage so that the impedance element maintains the first impedance.

Actually, the gain could also be related to the maximum voltage which can be output of the transducer. For many types of transducers, the maximum voltage output is that supplied to the transducer. The maximum output voltage is related to the (first) bias voltage supplied to the transducer, e.g. 50% of the (first) bias voltage, or 100%, or 150% thereof.

The first output terminal is connected to the connection element which receives a signal from the first output terminal and outputs a signal to the amplifier input.

The connection element may simply comprise a conductor directly feeding a signal received on the first output terminal to the amplifier input. However, different types of electrical components may be provided between the output terminal and the amplifier input, such as filters, attenuators or DC decoupling elements.

In addition, the connection element comprises the impedance element connected also to a predetermined voltage. This predetermined voltage may be a fixed voltage, such as ground, a voltage supplied to the amplifier or a voltage relating thereto. The function of the impedance element is to provide a high impedance to the first terminal and to aid in defining a voltage around which the output of the amplifier varies. In one embodiment, the predetermined voltage is a mean value (+/−20%, such as +/−10%) of a voltage supplied to the amplifier. If the amplifier is supplied 5V (ground and 5V), the predetermined voltage may be around 2.5V. If the amplifier is supplied +5V and −5V, the predetermined voltage may be around 0V.

Thus, when a signal is received on the first output terminal, a voltage will be provided over the impedance element. If this voltage is at or below the threshold voltage, the impedance is the first, higher impedance, which is a preferred manner of operation.

However, when the voltage over the impedance element exceeds the threshold voltage, the impedance is the second, lower impedance, which is not a desired manner of operation but which is a natural but undesired feature of the impedance element.

The first impedance is higher than the second impedance. Preferably, the first impedance is 100 GOhm or higher, and the second impedance is 10 GOhm or less, such as 1 GOhm or less.

Impedance elements of this type may comprise, or even be made of, diodes, such as pairs of diodes placed in an anti-parallel set-up. Anti-parallel diodes both connected to the same elements (on either side of the diodes; such as to the predetermined voltage and the terminal or amplifier input) and are oppositely directed. Additional circuits may be added at one or both ends of the anti-parallel diodes.

In usual diodes, if the voltage is below +/−0.3-0.7V (depending on the type of diode), the (first) impedance is high (preferably 100 GOhm or higher). However, if the voltage exceeds this threshold voltage (called the forward voltage), the impedance will decrease drastically (usually to 10 GOhm or less, such as 1 GOhm or less). This is an undesired operational mode in many situations, such as when a transducer is connected to the terminals. The loop-back of the filter to the second terminal may assist in preventing this.

Other types of impedance elements may be seen in U.S. Pat. No. 7,149,317, which is hereby incorporated herein by reference in its entirety.

Naturally, the threshold voltage may be increased, such as multiplied by an integer, by providing a number of such impedance elements (the same number) in series.

The output of the amplifier is connected to the filter circuit feeding a signal to the second output terminal. The operation of the filter is mainly to block any DC signal output of the amplifier but to feed an AC signal to the second output terminal. Preferably, the AC signal comprises the full frequency range of any signal received on the first output terminal, so that the feed-back is not frequency filtered but merely DC-blocked.

In some situations, the filter circuit may be configured to filter away some frequencies, if these are not required or not required removed in the output of the amplifier.

In most embodiments, another impedance element as that described above, may also be provided between the first output terminal and a predetermined feeding voltage, such as the first voltage.

In order to allow the amplifier to output a signal with the desired gain and without distortion, it may be desired to supply the amplifier with a voltage sufficient for that purpose. The sensing system may thus comprise a second voltage supply for providing a second voltage to the amplifier. This second voltage may be derived from the first voltage if desired.

In order for the amplifier to output a signal of the desired amplitude, it may be desired to have the second voltage be at least 60% of the first voltage, such as at least 80% or at least 100% thereof.

Usually, the threshold voltage is rather low. Then, often, the second voltage is at least 2 times the threshold voltage, such as at least 3, 4, 5, 6, 7, 8, 9, 10, 15 or 20 times the threshold voltage.

In one embodiment, the filter circuit comprises a high pass filter having a predetermined cut-off frequency. Preferably, this cut-off frequency is below 200 Hz, such as below 150 Hz, such as below 100 Hz, such as below 50 Hz, such as below 20 Hz, such as below 10 Hz, such as below 5 Hz, such as below 1 Hz. In order to provide an amplifying circuit suitable for many types of transducers, the cut-off frequency may be programmable or selectable.

In one embodiment, the filter circuit comprises a capacitor. A capacitor automatically blocks DC and allows AC signals to pass. The capacitance of the capacitor may be selected in order to ensure that it passes the frequencies of interest. Naturally, this capacitance may also be selectable or programmable, such as by selecting between a number of capacitors of the amplifying circuit, to adapt the circuit to e.g. a particular transducer or a particular task.

In one embodiment, the connection element comprises a capacitor between the first terminal and the amplifier input. Also in this manner, a DC blocking and optionally or additionally a filtering may be provided. Especially when capacitive transducers are used, DC de-coupling is desired. Again, the capacitance may be selected to obtain the desired operation/filtering/de-coupling.

In one embodiment, the sensing system further comprises a second voltage supply for providing a second voltage to the amplifier, wherein the second voltage is at least 60% of the first voltage. When the amplifier supply voltage is rather high, the amplifier is able to handle a larger input voltage and thus capable of handling the transducer output without distortion.

A second aspect of the invention relates to an amplifying circuit for use in the sensing system according to any of the preceding claims, the amplifying circuit comprising:
 a first terminal and the second terminal,
 the first voltage supply,
 the amplifier,
 the connection element connecting the first terminal to the amplifier input and
 the filter circuit,
where the gain is as described above.

In this context, the amplifying circuit may be a monolithic element, such as a chip, ASIC, FPGA, DSP or the like, or may be made of separate elements in communication with each other, such as elements provided on a Printed Circuit Board.

The circuit comprises a first terminal and a second terminal. A terminal may be a conducting element configured to be electrically connected to an additional element, such as a transducer (see further below). The terminals may be connected to the output terminals of a suitable transducer. As described, the transducer may require a particular adaptation of the filter circuit and the supply voltage.

Naturally, additional terminals or conductors may be provided for connecting to additional components or elements or for receiving power for e.g. the amplifier. Also, terminals, if not constituted by the first/second terminals, may be provided for outputting power (voltage and/or current) to components or elements external to the circuit.

The amplifying circuit comprises the first voltage supply in order to possibly form a complete building block to which only the transducer needs be connected in order to form a sensor. Also, the other impedance element and/or the above second voltage supply, may be provided in the amplifying circuit.

The present embodiments may be combined with a number of other advantageous improvements of systems, such as the Applicants co-pending applications filed on even date and with the titles: "A CIRCUIT FOR PROVIDING A HIGH AND A LOW IMPEDANCE AND A SYSTEM COMPRISING THE CIRCUIT", claiming priority from EP16199644.2, "A TRANSDUCER WITH A HIGH SENSITIVITY", claiming priority from EP16199651.7, "AN ASSEMBLY AND AN AMPLIFIER FOR USE IN THE ASSEMBLY", claiming priority from EP16199655.8 and "A PHASE CORRECTING SYSTEM AND A PHASE CORRECTABLE TRANSDUCER SYSTEM", claiming priority from EP16199657.4. These references are hereby incorporated herein by reference in their entireties.

BRIEF DESCRIPTION OF THE DRAWINGS

In the following, preferred embodiments of the invention will be described with reference to the drawing, wherein.

DETAILED DESCRIPTION OF THE INVENTION

Figure 1:
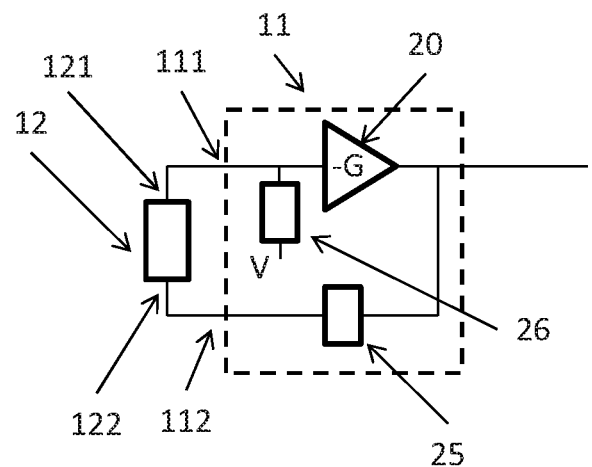
FIG. 1 illustrates a generic embodiment of a sensing system according to the invention.

FIG. 1 illustrates a generic example of an embodiment of the present invention where a transducer 12 with two output terminals, 121 and 122. The output terminal 121 is connected to a first terminal 111 of an amplifying circuit 11 and to an amplifier input of an amplifier 20, the output of which is connected to another terminal 112 of the circuit 11 and further to the other output terminal 122 of the transducer 12. An AC coupling element 25 is provided between the amplifier output and the terminal 112 of the circuit 11.

An impedance element 26 is provided. One end of the impedance element is connected to the terminal 111 or amplifier input, and the other to a predetermined voltage V, such as ground or e.g. a voltage between the supply voltages supplied to the amplifier. If the amplifier is supplied with Vm and ground, the voltage V may be Vm/2 in order to allow the amplifier output to output a signal symmetrical between the 0V and Vm supplied to the amplifier.

In one embodiment, the impedance element (see FIG. 2) is a pair of anti-parallel diodes. A number of such pairs may be provided in series if desired. In addition or alternatively, one or more voltage dependent resistors may be used.

The desired function of the impedance element 26 is to ensure a high impedance of the terminal 111. An undesired function, however, of the impedance element 26 is that the high impedance is only upheld within a predetermined threshold voltage range. If the voltage received on the terminal 111 exceeds that threshold voltage, the impedance of the impedance element will drop. This may distort the input signal to the amplifier and thus the signal output on the amplifier. Also, if the transducer is a capacitive transducer, the transducer may be brought out of its constant charge mode and may pull-in at large signal values.

Providing the amplifier with a negative gain and looping back a corresponding signal to the other terminal 122 of the transducer, however, reduces the signal value on the terminal 121, whereby the voltage over the impedance element 26 is reduced.

The present AC coupling element 25 prevents any DC level from passing from the amplifier output to the terminal 112 but preferably passes all variations (AC) at least within a predetermined frequency interval including a resonance frequency of the transducer. Preferably, all frequencies pas the coupling element 25 at which the transducer may generate a signal. In this context, the attenuation caused by the element 25 is so that the frequency as which the element 25 attenuates 3 dB is 1 Hz or 10 Hz or 20 Hz, such as below 20 Hz, below 10 Hz or below 5 Hz.

Naturally, a number of different AC coupling elements may be used. A very simple element of this type is a capacitor.

Slightly more complex systems are high pass filters, which also usually comprise a capacitor.

Any type of transducer may be used in connection with this amplifier circuit 11, such as microphones, vibration sensors or the like. Such sensors output a signal varying in accordance with a parameter sensed. This parameter may be a parameter of the transducer or it surroundings, such as a vibration of the transducer or a sound received.

In order to adapt the circuit 11 for use with different types of transducers, it may be desired to provide different elements and vary parameters of the amplifier circuit, such as (taken alone or in any combination):

The supply voltage to the amplifier 20,

The absolute value of the gain of the amplifier,

A presence of and capacitance of a capacitor positioned between the terminal 111 and the amplifier input, A presence of and a capacitance of a capacitor of the AC coupler 25.

A cut-off frequency of a high-pass filter if present in the AC coupler 25.

Figure 2:
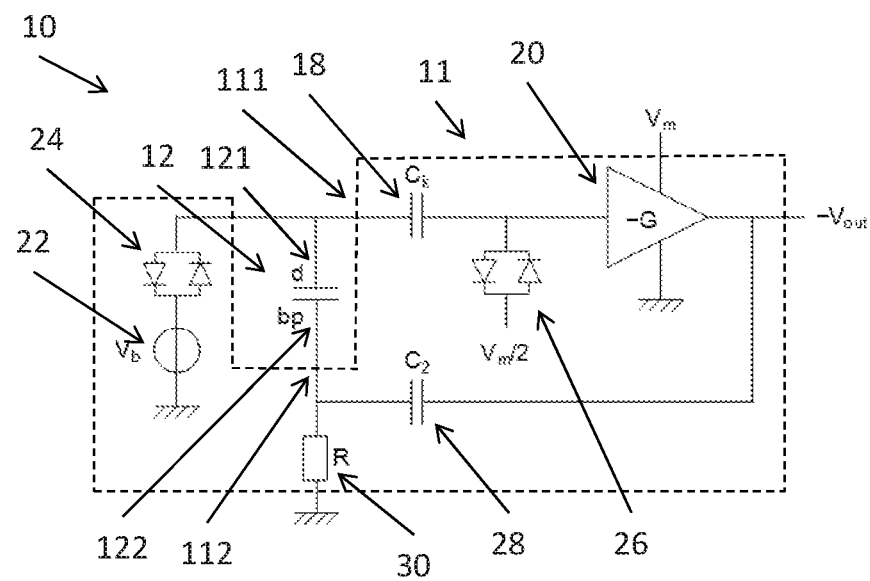
FIG. 2 illustrates a first embodiment of a biased sensing system according to the invention.

In FIG. 2, a set-up 10 is illustrated where the transducer 12 is a biased MEMS transducer having a diaphragm d and a back plate bp between which a biasing voltage is provided.

An output of the transducer 12 is correlated with a distance between the diaphragm and back plate so that when the diaphragm is vibrated, such as when exposed to sound, a correspondingly varied output is seen.

The output of the transducer 12 is fed through a capacitor 18 to the amplifier 20. The desired operation of the capacitor 18 is to transfer the varying signal from the transducer to the amplifier input without creating a DC connection between the diaphragm and the remainder of the circuit, as this could destroy the constant charge nature of the biasing of the transducer. Thus, the capacitor preferably has a value being sufficiently high. At present, the capacitor 18 is at least 2, such as at least 4, such as at least 6, such as at least 8 times the capacitance of the transducer.

In usual set-ups of this type, a biasing circuit is provided comprising a charge pump 22 and a pair of anti-parallel diodes 24 generating a high impedance at the terminal 121 where the signal is derived (diaphragm in this example).

A power supply is provided for supplying the amplifier 20 with a voltage Vm (and ground). The high impedance element 26 is provided between the amplifier input and Vm/2, as this will act to centre the signal input to the amplifier input around this value, so that the same head room is seen below and above this value. Naturally, this voltage may be chosen differently, such as slightly below this mean voltage.

Again, the feedback is provided feeding the output of the amplifier 20 back to the terminal 112 via a capacitor 28 which, together with a resistor 30, forms a high pass filter feeding a high pass filtered output signal to the other terminal 122 (here the back plate) of the transducer.

One may call the diaphragm, in this embodiment, a high impedance terminal, as the impedance is defined by the diodes 24 creating a high impedance, and the back plate a low impedance terminal, as the resistor 30 value preferably is much lower than the impedance of the diodes 24.

As it is desired that the terminal 122 follows the output of the amplifier, it is desired that the resistance of the resistor 30 is larger than the output impedance of the amplifier. Then, the amplifier is capable of driving the voltage across this resistor, and thus the voltage on terminal 122 over a large range.

Then, the capacitance of capacitor 28 could be matched to the resistance of resistor 30 to obtain the desired cut-off frequency of the high pass filter created by the resistor 30 and the capacitor 28.

Now, the cut-off frequency of the high pass filter may be selected to be very low to allow as much of the signal to be fed back. Preferably, the cut-off of the high-pass filter is lower than the lowest frequency the transducer can produce, so that the overall effect of the high pass filter is that of a DC decoupling.

For most of the transducers used, the output thereof and consequently the output of the transducer will be very low for very low frequencies. One reason for this may be, in microphones, if a vent is provided in the diaphragm allowing pressure compensation but also attenuating frequencies normally below 30 Hz, such as below 50 Hz. Normally, a good output is seen at at least 70 Hz.

Preferably, and especially in relation to microphones, the high pass filter has a cut-off frequency below 50 Hz so as to allow at least substantially all of the frequencies output from the transducer to be fed back.

In addition, the slope of the high pass filter may be selected so that the resulting filtering of the transducer signal is suitable.

The output swing of biased transducers may be higher than their biasing voltage, as the diaphragm may move from a position far from its rest position and far away from the back plate to an opposite position very near to the back plate. Thus, in theory, the output of the transducer may be up to twice the biasing voltage. Often, the movement of the diaphragm is physically limited in the direction toward and close to the back plate in order to ensure that the diaphragm does not touch the back plate. This is especially problematic at the resonance frequencies.

The gain of the amplifier is selected so that the feed back to the terminal 122 keeps the signal output on terminal 121 always below the threshold voltage. Naturally, the voltage supply Vm of the amplifier may be selected so as to be able to handle the full output signal intensity of the transducer, as any distortion in the amplifier would also be fed back to the transducer.

Consequently, in order for the amplifier to be able to handle such an output swing, the amplifier may be supplied a comparable supply voltage being at least 20%, such as at least 50%, such as at least 60%, such as at least 80% and even at least 90%, 100%, 120%, 125%, 130%, 140% or more times the biasing voltage fed to the transducer.

In this manner, the output swing of the operating amplifier may be sufficiently large for it to handle the output of the transducer caused by the operation of the transducer—to output a signal low enough to arrive at the desired signal at the amplifier input. This compensation is made without distorting or removing part of the received signal.

The schematic diagram shows a possible embodiment of the invention. For large enough values of G, the voltage swing at the input of the amplifier is small, and also on the diaphragm terminal of the transducer.

In the figure, the amplifying circuit 11 is illustrated as incorporating the resistor 30. This is not a requirement. Also, the capacitor 18 may be provided outside of the circuit 11.

Also, the circuit is illustrated to comprise the diodes 24, the voltage supply 22 and/or the supply Vm to the amplifier, if desired.

Thus, the circuit 11 may have two terminals which need only be connected directly to the transducer 12—all other components and elements being provided in the circuit 11. Circuits of this type may be provided in a single circuit/chip/ASIC/FPGA or the like. A circuit of this type may also have one or more power/voltage inputs. If a single voltage input is provided, the circuit may have one or more voltage converters (preferably programmable) to generate the voltage for the amplifier, the element 26 and the transducer 12.

Figure 3:
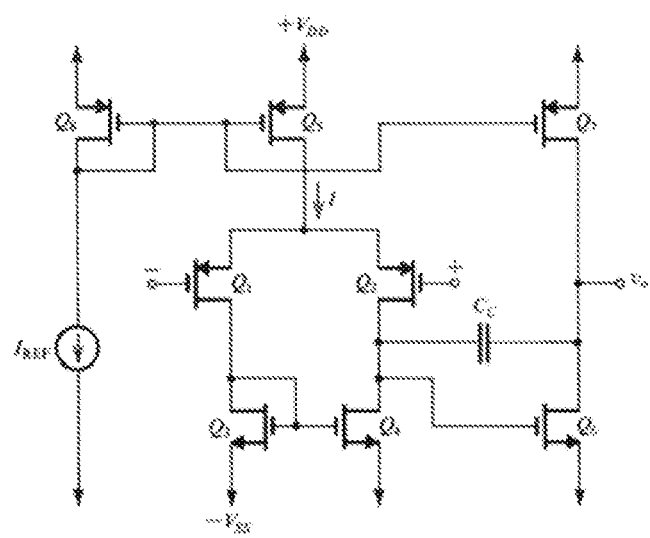
FIG. 3 illustrates an embodiment of an amplifier suitable for use in filtering circuits according to the invention.

Naturally, many possible implementations exist for the amplifier 20. One example of a textbook example diagram is given in FIG. 3.

The gain of the amplifier 20 naturally may be adapted to the individual situation. This gain may depend on the steepness of the filter or the filter's attenuation at especially the resonance frequency/ies of the transducer. If the filter attenuates at this frequency, the amplifier gain may be selected higher.

The gain should bring the voltage over the element 26 below the forward voltage or break-down voltage of that element.

If a single pair of diodes is used, the forward voltage is typically 0.3-0.7 depending on the technology. If the output of the transducer is e.g. +/−10V, a gain of 20× would bring 10V down to +/−½V.

The gain thus may be adapted to not only the element 26 but also to the transducer used. Biased MEMS transducers, for example, usually output voltages in the +/−10V range. Other transducer types may output voltages in a broader voltage range, requiring a larger gain for the same element 26.

It is noted that the transducer 12 may be any type of transducer, biased or not. Thus, the transducer may be a MEMS unit, an electret unit, a capacitive transducer, a piezo electric element, a balanced armature unit, a moving armature unit, a moving coil unit or the like.

Also, different types of biased transducers may be used, such as transducers having multiple back plates where the biasing is between either the back plates or the diaphragm and a back plate. Naturally, the output of the transducer may be derived from the diaphragm or a back plate or from both back plates such as if connected to the inputs of a differential amplifier.

Also, filters of other types, such as higher order filters or attenuators, may be used as the AC coupling element. Such filters/attenuators may require a power supply or be passive.

The invention claimed is:

1. A sensing system comprising:
   a transducer having a first output terminal and a second output terminal,
   a first voltage supply configured to supply a first voltage to the first output terminal,
   an amplifier having an amplifier input and an amplifier output,
   a connection element connecting the first output terminal to the amplifier input, the connection element comprising an impedance element connected also to a predetermined voltage, the impedance element having:
   a first impedance, when a voltage over the impedance element is below a threshold voltage and
   a second impedance, lower than the first impedance, when a voltage over the impedance element exceeds the threshold voltage, the first impedance exceeding the second impedance and
   a filter circuit blocking DC but transferring AC, the circuit connected to the amplifier output configured to feed an AC signal to the second output terminal,
   where the amplifier amplifies the signal from the connection element into an amplified signal fed to the filter circuit, the amplifier having a negative amplification with an absolute value higher than or equal to the first voltage divided by the threshold voltage, the absolute value being at least 2.

2. A sensing system according to claim 1, wherein the transducer comprises a diaphragm and one or more back plates, the first voltage being provided between two of the back plate(s) and the diaphragm.

3. A sensing system according to claim 1, wherein the impedance element comprises two diodes positioned in an anti-parallel set-up.

4. A sensing system according to claim 1, further comprising a second voltage supply for providing a second voltage to the amplifier.

5. A sensing system according to claim 4, wherein the second voltage is at least 60% of the first voltage.

6. A sensing system according to claim 4, wherein the second voltage is at least 2 times the threshold voltage.

7. A sensing system according to claim 1, wherein the transducer is capable of outputting a maximum voltage, the absolute value of the gain being at least the maximum value divided by the threshold voltage.

8. A sensing system according to claim 1, wherein the filter circuit comprises a high pass filter having a predetermined cut-off frequency.

9. A sensing system according to claim 1, wherein the filter circuit comprises a capacitor.

10. A sensing system according to claim 9, wherein the capacitor has a programmable or selectable capacitance.

11. A sensing system according to claim 1, wherein the connection element comprises a capacitor between the first terminal and the amplifier input.

12. An amplifying circuit for use in the sensing system according to claim 1, the amplifying circuit comprising:
    a first terminal and a second terminal,
    a first voltage supply configured to supply a first voltage to the first terminal,
    an amplifier having an amplifier input and an amplifier output,
    a connection element connecting the first terminal to the amplifier input, the connection element comprising an impedance element connected also to a predetermined voltage, the impedance element having:
    a first impedance, when a voltage over the impedance element below a threshold voltage and
    a second impedance, lower than the first impedance, when a voltage over the impedance element exceeds the threshold voltage, and
    a filter circuit blocking DC but transferring AC, the circuit connected to the amplifier output configured to feed an AC signal to the second terminal,
    the amplifier amplifies the signal from the connection element into an amplified signal fed to the filter circuit, the amplifier having a negative amplification with an absolute value higher than the first voltage divided by the threshold voltage, the absolute value being at least 2.

13. An amplifying circuit according to claim 12, further comprising a second voltage supply for providing a second voltage to the amplifier.

14. An amplifying circuit according to claim 13, wherein the second voltage is at least 60% of the first voltage.

15. An amplifying circuit according to claim 13, wherein the second voltage is at least 2 times the threshold voltage.

\* \* \* \* \*